United States Patent
Andersson

(10) Patent No.: US 6,826,206 B1
(45) Date of Patent: Nov. 30, 2004

(54) METHOD OF CHARACTERIZING A TUNEABLE LASER

(75) Inventor: Lars Andersson, Belle Mead, NJ (US)

(73) Assignee: ADC Telecommunications, Inc., Eden Prairie, MN (US)

(*) Notice: Subject to any disclaimer, the term of this patent is extended or adjusted under 35 U.S.C. 154(b) by 0 days.

(21) Appl. No.: 09/913,845

(22) PCT Filed: Feb. 15, 2000

(86) PCT No.: PCT/SE00/00292

§ 371 (c)(1),
(2), (4) Date: Jan. 2, 2002

(87) PCT Pub. No.: WO00/54380

PCT Pub. Date: Sep. 14, 2000

(30) Foreign Application Priority Data

Feb. 17, 1999 (SE) ............................................... 9900536

(51) Int. Cl.[7] ............................................... H01S 3/10
(52) U.S. Cl. ............................ 372/20; 372/43; 372/44; 372/45
(58) Field of Search .............................. 372/20, 44, 45

(56) References Cited

U.S. PATENT DOCUMENTS

| | | | | |
|---|---|---|---|---|
| 4,608,697 A | * | 8/1986 | Coldren ....................... | 372/50 |
| 4,680,810 A | | 7/1987 | Swartz ....................... | 455/609 |
| 4,792,956 A | | 12/1988 | Kamin ........................ | 372/29 |

(List continued on next page.)

FOREIGN PATENT DOCUMENTS

| | | |
|---|---|---|
| EP | 0 275 974 | 7/1988 |
| EP | 0 300 790 | 1/1989 |
| EP | 0 512 541 A2 A3 | 11/1992 |
| EP | 0 529 732 | 3/1993 |
| EP | 0 545 534 | 6/1993 |
| EP | 0 616 321 | 9/1994 |
| EP | 0 774 684 | 5/1997 |
| EP | 0 774 684 A2 A3 | 5/1997 |
| GB | 2163286 | 2/1986 |
| SE | 9900537-3 | 8/2001 |
| WO | WO 98/00893 | 1/1998 |
| WO | WO 99/40654 | 8/1999 |
| WO | WO 00/49693 | 8/2000 |
| WO | WO 00/54380 | 9/2000 |
| WO | WO 01/03262 | 1/2001 |
| WO | WO 01/76028 | 10/2001 |
| WO | WO 01/76029 | 10/2001 |

OTHER PUBLICATIONS

Lavrova et al., "Accelerated Aging and Reliability Studies of Multisection Tunable GCSR Lasers for Dense WDM Applications," Optical Fiber Communication Conference, 2000, Mar. 70–10, 2000, vol. 1, ISBN: 1–55752–630–3.

Ishll et al., "Mode Stabilization Method for Superstructure–Grating DBR Lasers," Journal of Lightwave Technology, vol. 16, No. 3, Mar. 1998, pp. 433–442.

*Primary Examiner*—Minsun Oh Harvey
*Assistant Examiner*—Dung Nguyen
(74) *Attorney, Agent, or Firm*—Carlson, Caspers Vandenburgh & Lindquist

(57) ABSTRACT

A method of evaluating a tuneable laser and determining suitable laser operation points. Part of the light emitted by the laser is led to a Fabry-Perot filter and to a pair of light detectors to measure the power of the laser and deliver a corresponding output signal representative of the wavelength of the detected light. Injected currents are swept through the laser tuning sections to pass through different current combinations, and the ratio between the detector signals is measured during the sweep of the reflector current in both directions. The control combination for the tuning currents is stored when the ratio between the detector output signals lies within a predetermined range signifying that the emitted light lies within one of a number of wavelengths given by the Fabry-Perot filter, and the ratio lies within the predetermined range for a given reflector current in both sweep directions of the reflector current.

6 Claims, 2 Drawing Sheets

U.S. PATENT DOCUMENTS

| | | | | |
|---|---|---|---|---|
| 4,896,325 A | * | 1/1990 | Coldren | 372/20 |
| 4,920,542 A | * | 4/1990 | Brosson et al. | 372/50 |
| 5,019,769 A | | 5/1991 | Levinson | 372/31 |
| 5,299,045 A | | 3/1994 | Sekiguchi | 359/130 |
| 5,351,253 A | | 9/1994 | Wong | 372/38 |
| 5,359,613 A | | 10/1994 | Mols et al. | 372/20 |
| 5,383,208 A | | 1/1995 | Queniat et al. | 372/29 |
| 5,473,625 A | | 12/1995 | Hansen et al. | 372/96 |
| 5,488,503 A | | 1/1996 | Schaffner et al. | 359/245 |
| 5,541,945 A | | 7/1996 | Yamaguchi et al. | 372/20 |
| 5,581,572 A | | 12/1996 | Delorme et al. | 372/50 |
| 5,602,860 A | | 2/1997 | Masonson | 372/34 |
| 5,691,989 A | | 11/1997 | Rakuljic et al. | 372/20 |
| 5,732,102 A | | 3/1998 | Bouadma | 372/46 |
| 5,754,579 A | | 5/1998 | Mizoguchi et al. | 372/58 |
| 5,789,274 A | | 8/1998 | Yamaguchi et al. | 438/32 |
| 5,812,572 A | | 9/1998 | King et al. | 372/38 |
| 5,832,014 A | * | 11/1998 | Johnson | 372/32 |
| 5,872,479 A | | 2/1999 | Shin | 327/537 |
| 5,909,297 A | * | 6/1999 | Ishikawa et al. | 398/198 |
| 5,917,637 A | | 6/1999 | Ishikawa et al. | 359/181 |
| 6,064,681 A | | 5/2000 | Ackerman | 372/32 |
| 6,097,487 A | | 8/2000 | Kringlebotn et al. | 356/345 |
| 6,163,555 A | | 12/2000 | Siddiqui et al. | 372/32 |
| 6,192,058 B1 | | 2/2001 | Abeles | 372/6 |
| 6,215,804 B1 | | 4/2001 | Sahlen et al. | 372/50 |
| 6,292,497 B1 | | 9/2001 | Nakano | 372/29.015 |
| 6,298,075 B1 | | 10/2001 | Kitaoka et al. | 372/33 |
| 6,321,003 B1 | | 11/2001 | Kner et al. | 385/24 |
| 6,323,726 B1 | | 11/2001 | Berger et al. | 327/551 |
| 6,333,263 B1 | | 12/2001 | Ngo et al. | 438/669 |
| 6,359,915 B1 | | 3/2002 | Koch et al. | 372/29.02 |
| 6,373,568 B1 | | 4/2002 | Miller et al. | 356/326 |
| 6,504,856 B1 | | 1/2003 | Broberg et al. | 372/38.07 |
| 6,587,485 B1 | | 7/2003 | Renlund et al. | 372/20 |
| 6,629,638 B1 | | 10/2003 | Sanchez | 235/454 |
| 6,658,028 B1 | | 12/2003 | Andersson | 372/18 |
| 6,658,033 B1 | | 12/2003 | Andersson | 372/38.02 |
| 6,658,083 B2 | | 12/2003 | Sai | 378/34 |

* cited by examiner

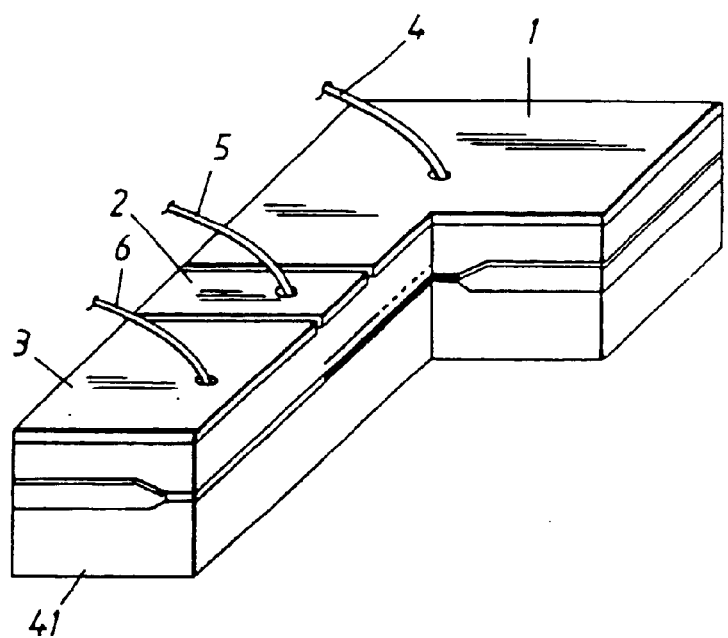
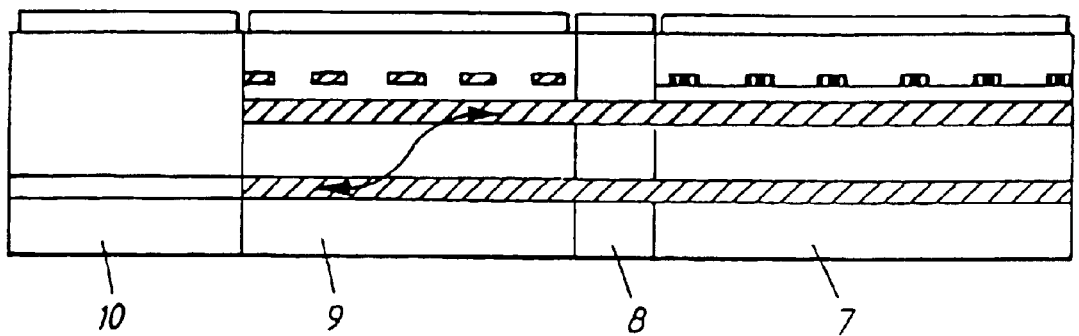

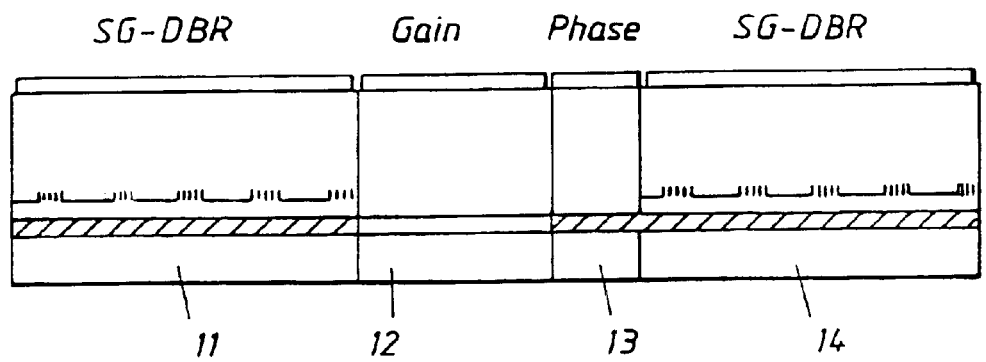
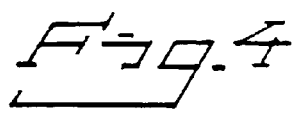
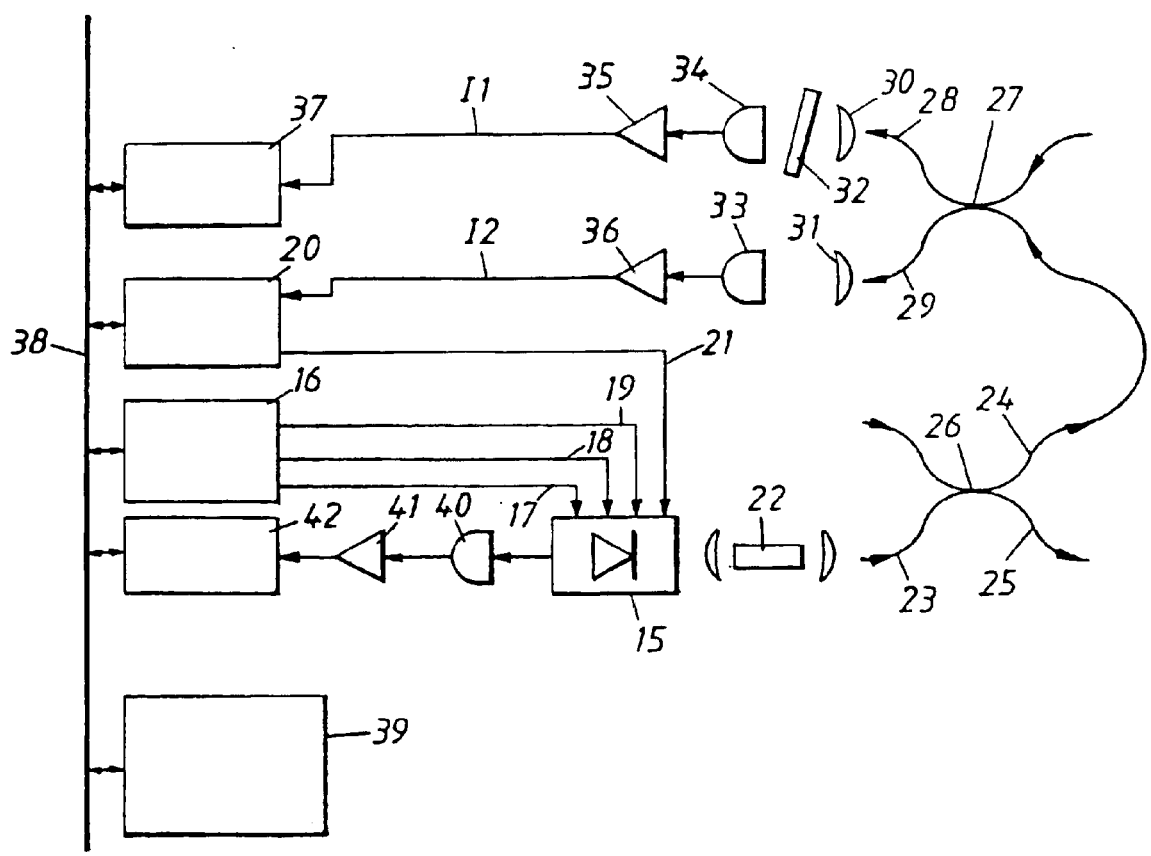

METHOD OF CHARACTERIZING A TUNEABLE LASER

BACKGROUND OF THE INVENTION

1. Field of the Invention

The present invention relates to a method of enabling a tuneable laser to be characterized quickly.

The method can be applied for evaluating and selecting lasers with respect to emitted wavelength and to find good operation points systematically.

2. Description of the Related Art

Tuneable semiconductor lasers have a number of different sections through which current is injected, typically three or four such sections. The wavelength, power and mode purity of the lasers can be controlled by adjusting the current injected into the various sections. Mode purity implies that the laser is at an operation point, i.e., at a distance from a combination of the drive currents where so-called mode jumps take place, and where lasering is stable and side mode suppression is high.

In the case of telecommunications applications, it is necessary that the laser is able to retain its wavelength to a very high degree of accuracy and over very long periods of time, after having set the drive currents and the temperature. A typical accuracy in this respect is 0.1 nanometer and a typical time period is 20 years.

In order to be able to control the laser, it is necessary to map the behavior of the laser as a function of the various drive currents. This is necessary prior to using the laser after its manufacture.

Mapping of the behavior of a laser is normally effected by connecting the laser to different measuring instruments and then varying the drive currents systematically. Such instruments are normally power meters, optical spectrum analyzers for measuring wavelength and sidemode suppression, and line width measuring devices. This laser measuring process enables all of these parameters to be fully mapped as a function of all different drive currents.

One problem is that lasers exhibit hysteresis. As a result of the hysteresis, the laser will deliver different output signals in the form of power and wavelength in respect of a given drive current set-up, i.e., with respect to a given operation point, depending on the path through which the laser has passed with respect to the change in said drive currents, in order to arrive at the working point in question. Thus, this means that a given drive current set-up will not unequivocally give the expected wavelength or power.

In the case of a tuneable laser, the wavelength of the emitted light is determined mainly by the current or voltage across the tuning sections. The power emitted is controlled by current to the gain section of the laser or by the voltage across said section.

When characterizing a laser, all of the possible control combinations afforded by the tuning sections, or a subset of said sections, are investigated. During the characterizing process, the emitted light is studied with respect to wavelength and sidemode suppression and controlling the gain section with regard to power adjustment.

The enormous number of possible control combinations, typically tens of billions, of which fewer than a hundred will be selected, makes total mapping of the laser impossible in view of the large amount of data generated.

SUMMARY OF THE INVENTION

The present invention solves this problem and provides a method of quickly sorting away control combinations that do not result in correct wavelengths.

The present invention also relates to a method of evaluating a tuneable laser and determining suitable laser operation points for a laser that includes two or more tuneable sections, in which injected current can be varied and of which at least one is a reflector section and one is a phase section. The method includes leading part of the light emitted by the laser to an arrangement that includes a Fabry-Perot filter and a first and a second detector, said detectors being adapted to measure the power of the light and to deliver a corresponding detector signal. The detectors are arranged relative to the Fabry-Perot filter such that the data signals will contain information relating at least to the wavelength of the detected light. The currents are swept through the tuning sections so as to pass through different current combinations, and the ratio between the two detector signals during said sweeps is measured. The reflector current in the inner sweep variable is swept in one direction and then in the opposite direction back to its start value. The control combination for the tuning currents is stored when the ratio between the detector signals lies within a predetermined range that indicates that the light emitted lies within one of a number of wavelengths given by the Fabry-Perot filter, and when the ratio lies within said predetermined range for a given reflector current in both sweep directions of said current.

BRIEF DESCRIPTION OF THE DRAWINGS

The invention will now be described in more detail with reference to exemplifying embodiments thereof and also with reference to the accompanying drawings, in which FIG. 1 is a perspective, partially cut-away view of a DBR laser;

FIG. 2 is a sectional view of a tuneable Grating Coupled Sampled Reflector (GCSR) laser;

FIG. 3 is a sectional view of a Sampled Grating DBR laser; and

FIG. 4 is a schematic block diagram illustrating an arrangement which is used in accordance with the invention.

DESCRIPTION OF THE PREFERRED EMBODIMENTS

Shown in FIG. 1 is a DBR laser which includes three sections, namely a Bragg reflector 1, a phase section 2 and a gain section 3. Each section is controlled by injecting current into respective sections through respective electric conductors 4, 5, 6.

FIG. 2 is a sectional view of a tuneable Grating Coupled Sampled Reflector (GCSR) laser. Such a laser includes four sections, i.e., a Bragg reflector 7, a phase section 8, a coupler 9 and a gain section 10. Each of the sections is controlled by injecting current into the respective sections.

FIG. 3 is a sectional view of a Sampled Grating DBR laser that also includes four sections 11, 12, 13, 14, of which sections 11 and 14 are Bragg reflectors, section 13 is the phase section, and section 12 is the gain section.

These three laser types are common, although other types of lasers exist.

Although the invention is described below essentially with reference to a GCSR laser according to FIG. 2, it will be understood that the invention is not restricted to any particular type of tuneable semiconductor laser, but can be applied correspondingly with tuneable lasers other than those illustrated by way of example in the drawings.

The present invention relates to a method of evaluating tuneable lasers and determining suitable laser operation points. The laser may thus contain two or more tuneable sections in which injected current can be varied in a known manner. The laser is of the kind which includes at least one reflector section and one phase section.

FIG. 4 is a block diagram which illustrates an arrangement used in accordance with the present invention. The reference numeral 15 identifies a GCSR laser, while the reference numeral 16 identifies current generators for injecting current into the reflector section, the phase section and the coupler section respectively of said laser, through respective conductors 17, 18 and 19. The power of the laser is controlled to its gain section by means of a power regulating circuit 20, via a conductor 21.

The laser emits light from the front mirror to a light conductor 23, for instance a light-conducting fiber, via a lens pack 22. This light conductor leads the light to a light splitter or divider 26 which switches part of the light to another light conductor 24. The remainder of the light is led further in the light conductor 25. The light splitter 26 switches, e.g., 10%, of the light from the conductor 23 to the conductor 24.

The light conductor 24 leads the light to a second light splitter or divider 27, which functions to divide the light equally between two light conductors 28, 29. A lens 30 and a lens 31 are disposed at respective ends of the light conductors. A Fabry-Perot filter 32 is provided in the beam path downstream of the lens 30. The filter 32 is well known and will not therefore be described in more detail in this document. Fabry-Perot filters can be designed to exhibit a certain light transmission solely for certain wavelengths, normally wavelengths that are multiples of a given wavelength. The Fabry-Perot filter exhibits a deviating lower or higher transmission at other wavelengths.

A first detector 33 is provided downstream of the lens 31, and a second detector 34 is provided downstream of the Fabry-Perot filter. The detectors 33, 34 function to measure the power of the light and to deliver a corresponding detector signal to an A/D converter 37, via a respective amplifier 35, 36.

The A/D converter 37, the power regulating circuit 20 and the current generators 16 are all connected to a microprocessor 39 via a data bus 38. The microprocessor is adapted to control the current generators and the power regulating circuit in a desired and a well known manner, in response to the signals from the A/D converter 37 and the power regulating circuit 20.

According to the invention, part of the forwardly emitted light is thus conducted to the first detector 33 and also to the second detector 34, via the Fabry-Perot filter 32.

According to the invention, the currents on conductors 17, 18 and 19 through the tuning sections are swept so as to pass through different current combinations. The ratio between the two detector signals I1 and I2 is measured during said sweeps.

When sweeping the currents through the tuning sections, the reflector current is the inner sweep variable. It is meant by this that the reflector current is swept for different combinations of other tuning currents while holding said other currents constant. The reflector current is swept first in one direction and then in the opposite direction, back to its start value. For instance, the reflector current is swept from a zero value and up to its maximum value and then down to zero again.

By current control in the present document is meant that the current through the sections is controlled by current generators or, alternatively, by controlling the voltage across the sections.

In the case of the FIG. 4 embodiment, the first detector 33, the second detector 34 and the Fabry-Perot filter 32 are placed in the proximity of the front mirror of the laser. Alternatively, the components may equally as well be placed in the proximity of the rear mirror of the laser, in which case light emitted from the rear mirror of said laser is used to determine the wavelength.

The Fabry-Perot filter and the first and the second detector may be arranged relative to one another in a manner different from that shown in FIG. 4, so as to detect at least wavelengths. The first and the second detector may be arranged to measure light transmitted through the Fabry-Perot filter and/or light reflected towards the Fabry-Perot filter, such as to detect wavelengths.

The hysteresis effect exhibited by lasers causes the power output of the laser in respect of certain reflector currents, with otherwise constant conditions, to be different due to the reflector current having taken its existing value by virtue of the reflector current having increased to said value or having decreased from a higher value. The wavelength is also influenced by the hysteresis effect. Such operation points as those which lie in the regions of hysteresis with respect to the reflector current, or with respect to other tuning currents for those sections that exhibit hysteresis, are non-preferred operation points for a laser in operation.

Communication lasers are adapted to operate at certain given wavelengths that are included in a so-called channel plane, where each channel corresponds to a well defined wavelength. According to the invention, the Fabry-Perot filter 32 is adapted to have a certain given transmission for each wavelength included in the channel plane.

When the ratio between the detector signals I1/I2 from the detectors 33, 34 lies within a predetermined range implying that the emitted light lies within one of a number of wavelengths given by the Fabry-Perot filter and said ratio I1/I2 lies within said range for a given reflector current in both sweep directions of the reflector current, the control combination for the tuning currents is stored in accordance with the invention.

This range is given by the permitted channel width in the channel plane.

These control combinations thus fulfill the criteria that will give desired wavelengths and not result in any hysteresis effect.

In certain cases it is preferred that one or more other tuneable currents to sections that exhibit a hysteresis effect, excluding the reflector current, are swept so as to determine whether or not hysteresis occurs at a contemplated operation point.

According to one preferred embodiment, the signal I2 is delivered from the first detector 33 to the power regulating circuit 20. The regulating circuit is adapted to control the laser so that said laser will emit light at a constant power. This enables the ratio I1/I2 to be followed very easily in determining possible operation points.

According to another preferred embodiment of the invention, a monitor diode 40 is placed on the side of the laser opposite to that side on which the first and the second detectors are placed, said monitor diode being caused to measure the light emitted by the laser. The detected light measurement signal is led through an amplifier 41 to an A/D converter 42, whose output signal is delivered to the microprocessor 39. In this embodiment, one or more of the tuneable currents is chosen so as to minimize the ratio between the power of the rearwardly emitted light and the power of the forwardly emitted light, thereby enabling an optimum operation point for a channel to be selected from said possible operation points.

The monitor diode 40 is placed adjacent the rear mirror of the laser in the FIG. 4 embodiment.

It is highly preferred with a number of the possible operation points taken out to measure the wavelength emitted by the laser until an operation point has been obtained with each desired wavelength, wherewith the control combination for each operation point is stored. Thus, one control combination for each channel in the channel plane will be stored in the memory of the microprocessor.

It will be evident from the foregoing that the use of a Fabry-Perot filter enables all those control combinations that do not fulfil the criterion that the ratio between the currents I1/I2 shall lie within a certain given range to be sorted out. Moreover, it is sufficient for communications purposes to identify one control combination for each wavelength in the channel plane that lies in a region in which the laser exhibits no hysteresis.

The present invention thus solves the problem mentioned in the introduction.

Although different embodiments have been described, and therewith in respect of a GCSR laser, it will be obvious that the structural design of the described arrangement can be varied while achieving the same result. The invention can also be applied to lasers of a type other than GCSR lasers.

It will therefore be understood that the present invention is not restricted to the aforedescribed and illustrated exemplifying embodiments thereof and that variations can be made within the scope of the following claims.

What is claimed is:

1. A method of evaluating a tunable laser and determining suitable laser operation points, the laser including two or more tuning sections in which injected tuning currents can be varied, the two or more tuning sections comprising at least a phase section and a reflector section, the method comprising:

leading part of the output light emitted by the laser to a first detector that produces a first detector signal indicative of output power of the laser and to a second detector via a Fabry Perot filter, the second detector producing a second detector signal at least partly indicative of the wavelength of the light emitted by the laser;

sweeping the tuning currents to pass through different current combinations, including sweeping a current through the reflector section in one direction and then in a second direction;

determining ratios of the first and second detector signals corresponding to the different current combinations; and storing a control combination for the tuning currents, corresponding to an operation point, when the ratio of the first and second detector signals lies within a predetermined range signifying that the emitted light lies within one of a number of wavelengths given by the Fabry-Perot filter and the ratio lies within the predetermined range when the reflector current is swept in both the first and second directions.

2. A method according to claim 1, wherein the Fabry-Perot filter is operable to exhibit a certain transmission for each wavelength included in a channel plane which contains desired wavelengths and exhibits a transmission that deviates therefrom with respect to other wavelengths.

3. A method according to claim 1, including delivering the first detector signal to a power regulating circuit operable to control the laser to emit light with a constant power.

4. A method according to claim 1, including sweeping at least one tuning current other than the reflector current in different directions about a contemplated operation point to determine whether or not hysteresis occurs at the contemplated operation point.

5. A method according to claim 1, including measuring the wavelength transmitted by the laser at a number of the operation points until one operation point has been obtained for each desired wavelength, and storing the control combination for the operation points associated with the desired wavelengths.

6. A method according to claim 1, wherein the first and second detector detect light emitted from a first side of the laser, and further comprising:

monitoring power of light emitted from a second side of the laser with a monitor detector to produce a monitor signal indicative of the power emitted from the second side of the laser, and adjusting the tuning currents to reach an extreme in a ratio of the first detector signal and the monitor signal, thereby optimizing an operation point for the laser.

* * * * *